United States Patent [19]
Nagahori et al.

[11] Patent Number: 5,793,256
[45] Date of Patent: Aug. 11, 1998

[54] INTEGRATED CIRCUIT PREAMPLIFIER FOR AN OPTICAL RECEIVER

[75] Inventors: Takeshi Nagahori; Ichiro Hatakeyama; Soichiro Araki; Kazunori Miyoshi, all of Tokyo, Japan

[73] Assignee: NEC Corporation, Tokyo, Japan

[21] Appl. No.: 627,356

[22] Filed: Apr. 5, 1996

[30] Foreign Application Priority Data

Apr. 7, 1995 [JP] Japan ................................ 7-082883

[51] Int. Cl.$^6$ .................................................. H03F 3/04
[52] U.S. Cl. ........................... 330/296; 330/308; 330/311
[58] Field of Search ............................ 330/59, 296, 308, 330/310, 311; 250/214 A

[56] References Cited

U.S. PATENT DOCUMENTS

| | | | |
|---|---|---|---|
| 4,612,464 | 9/1986 | Ishikawa et al. | 327/94 X |
| 4,633,190 | 12/1986 | Malm | 330/297 X |
| 4,882,482 | 11/1989 | Smith et al. | 330/308 X |

*Primary Examiner*—James B. Mullins
*Attorney, Agent, or Firm*—Young & Thompson

[57] ABSTRACT

In a preamplifier for amplifying an input signal supplied to an input terminal to supply an amplified output signal and a reference output signal to an output terminal and a reference output terminal, respectively, a reference level circuit produces a reference level. An amplifier is connected to the reference level circuit and has a predetermined structure. The amplifier amplifies the input signal into the amplified output signal with reference to the reference level to supply the amplified output signal to the output terminal. A dummy circuit is connected to the reference level circuit and has a structure which is identical with the predetermined structure. The dummy circuit responds to the reference level to produce the reference output signal related to the amplified output signal.

8 Claims, 2 Drawing Sheets

INTEGRATED CIRCUIT PREAMPLIFIER FOR AN OPTICAL RECEIVER

BACKGROUND OF THE INVENTION

This invention relates to a preamplifier which is used in an optical receiver. Specifically, this invention relates to preamplifiers which are arranged in a monolithic integrated circuit.

An optical receiver is used for an optical communication system, such as an optical subscriber system, an optical local area network, and an optical interconnection. The optical receiver has a preamplifier to convert an input current signal into an amplified voltage signal.

A conventional preamplifier has a transimpedance amplifier having a predetermined structure and a reference signal producing circuit having a structure which is identical with the predetermined structure. The transimpedance amplifier and the reference signal producing circuit form a spurious differential structure which is to immune for electromagnetic interference.

The transimpedance amplifier is connected to an input terminal, an output terminal, and a power supply terminal. The transimpedance amplifier produces an output signal to the output terminal when the power supply terminal is supplied with electric power. In this condition, a level of the output signal changes with a change of a level of the input signal which is supplied to the input terminal. This means that the input signal is amplified into the amplified output signal.

On the other hand, the reference signal producing circuit is connected to the power supply terminal and a reference output terminal. The reference signal producing circuit sends a reference signal to the reference output terminal when the power supply terminal is supplied with the electric power. The reference signal is substantially equal in level to the output signal when the input signal is not supplied to the input terminal.

The conventional preamplifier has strong immunity to electromagnetic interference and can reduce an output direct current offset.

However, the transimpedance amplifier included in the conventional preamplifier is large in size and occupies a wide area in an integrated circuit. Likewise, the reference signal producing circuit in the conventional preamplifier is also large in size and occupies a wide area in the integrated circuit. Thus, the conventional preamplifier requires large area in the integrated circuit and is unsuitable to integrate a plurality of preamplifiers into a single chip.

SUMMARY OF THE INVENTION

It is an object of this invention to provide a preamplifier which has a small scale for an integrated circuit.

It is another object of this invention to provide a preamplifier which has a wide dynamic range.

It is still another object of this invention to provide a preamplifier which have good immunity to electromagnetic interference.

It is yet another object of this invention to provide a preamplifier which is operated by low voltage.

According to an aspect of this invention, a preamplifier is for amplifying an input signal supplied to an input terminal to supply an amplified output signal and a reference output signal to an output terminal and a reference output terminal, respectively, and comprises a reference level circuit for producing a reference level. An amplifier is connected to the reference level circuit and has a predetermined structure, for amplifying the input signal into the amplified output signal with reference to the reference level to supply the amplified output signal to the output terminal. A dummy circuit is connected to the reference level circuit and has a structure identical with the predetermined structure, for rendering the reference level into the reference output signal.

DESCRIPTION OF THE PREFERRED EMBODIMENT

Figure 1:
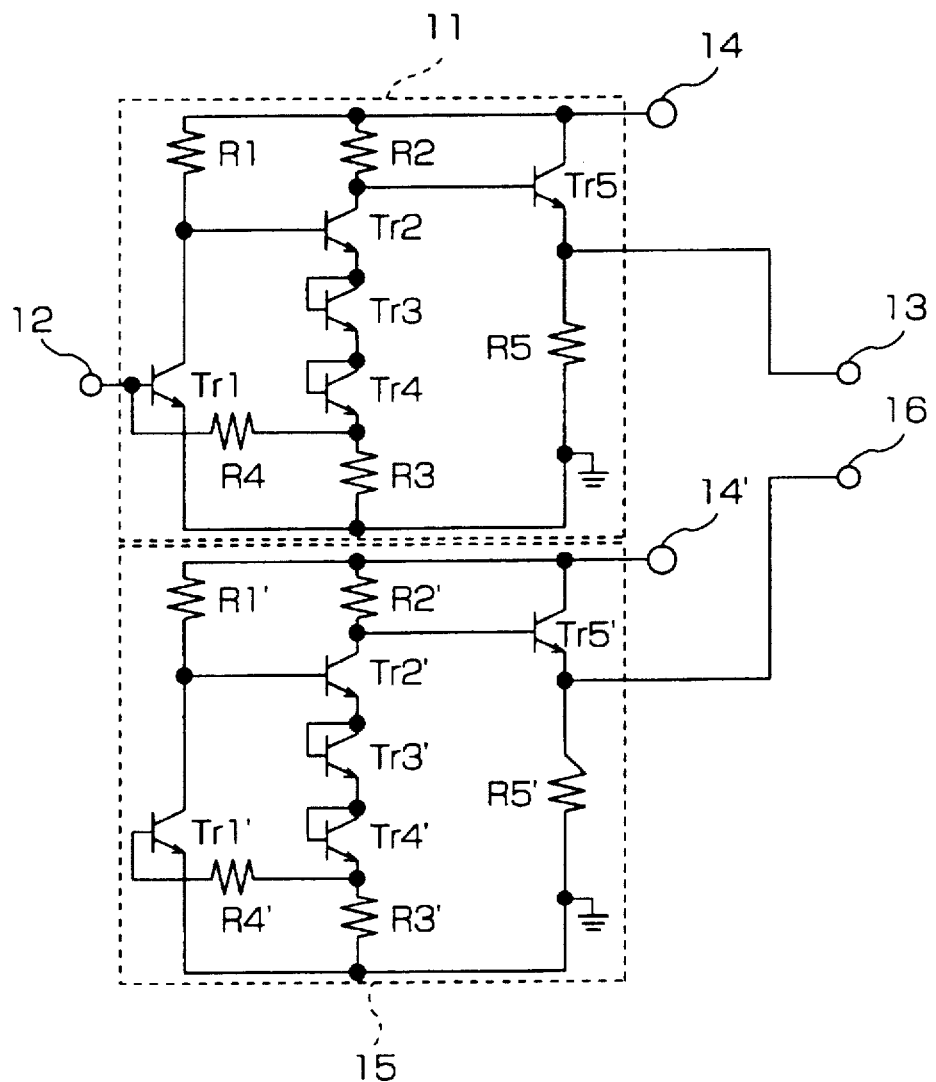
FIG. 1 is a circuit diagram of a conventional preamplifier.

Referring to FIG. 1, description will be directed to a conventional preamplifier which is used in an optical receiver. The conventional preamplifier comprises a transimpedance amplifier 11 which is connected to an input terminal 12, an output terminal 13, and a power supply terminal 14. A reference signal producing circuit 15 is connected to a reference output terminal 16 and a power supply terminal 14'. The power supply terminal 14' and the power supply terminal 14 may be electrically connected to each other.

The transimpedance amplifier 11 includes first through fifth npn bipolar transistors Tr1 to Tr5 and first through fifth resistors R1 to R5. A base of the transistor Tr1 is connected to the input terminal 12. A collector of the transistor Tr1 is connected to the power supply terminal 14 through the resistor R1. An emitter of the transistor Tr1 is connected to the ground. A base of the transistor Tr2 is connected to the collector of the transistor Tr1. A collector of the transistor Tr2 is connected to the power supply terminal 14 through the resistor R2. An emitter of the transistor Tr2 is connected to both a base and a collector of the transistor Tr3 which are connected in common. An emitter of the transistor Tr3 is connected to both a base and a collector of the transistor Tr4. An emitter of the transistor Tr4 is connected to both the ground through the resistor R3 and the base of the transistor Tr1 through the resistor R4. A base of the transistor Tr5 is connected to the collector of the transistor Tr2. A collector of the transistor Tr5 is connected to the power supply terminal 14. An emitter is connected to both the output terminal 13 and the ground through the resistor R5.

As shown in FIG. 1, the reference signal producing circuit 15 has a structure which is identical with that of the transimpedance amplifier 11. Herein, it is to be noted about the reference signal producing circuit 15 that a base of a transistor Tr1' is only connected to a resistor R4' and an emitter of a transistor Tr5' is connected to the reference output terminal 16.

When the power supply terminals 14 and 14' are supplied with an electric power from a power source (not shown), the transimpedance amplifier and the reference signal producing circuit produce an output signal and a reference output signal, respectively. The output signal and the reference output signal are substantially equivalent to each other as long as the input terminal 12 is not supplied with an input signal.

When the input signal is supplied to the input terminal 12, the output signal changes with change of the input signal. Namely, the input signal is amplified into an amplified output signal and the output signal is representative of the amplified output signal.

Herein, consideration should be given to electromagnetic interference which occurs in the inside and the outside of the optical receiver. In order to avoid influence due to electromagnetic interference, the preamplifier includes both the transimpedance amplifier 11 and the reference signal producing circuit 15. More specifically, the transimpedance amplifier 11 and the reference signal producing circuit 15 are supplied with the output signal and the reference output signal both of which are influenced by the electromagnetic interference.

If a difference between the output signal and the reference output signal is determined as an output signal of the conventional preamplifier, the difference does not include the influence. Consequently, the conventional preamplifier has good immunity to electromagnetic interference and can reduce an output direct current offset.

However, the conventional preamplifier has disadvantages mentioned in the preamble of the instant specification.

Figure 2:
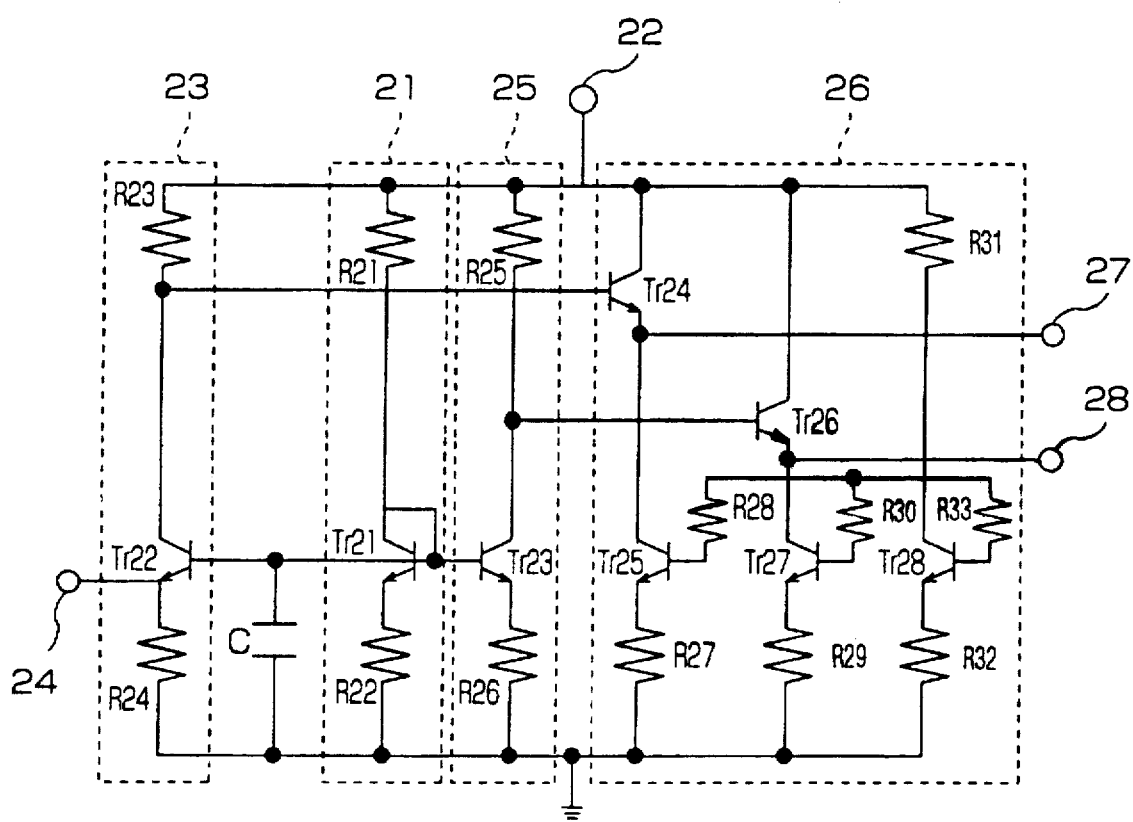
FIG. 2 is a circuit diagram of a preamplifier according to a preferred embodiment of this invention.

Referring to FIG. 2, description will be made about a preamplifier according to a preferred embodiment of this invention. The preamplifier comprises a reference level supply circuit 21 which is connected to a power supply terminal 22 and produces a reference level. A common base circuit 23 is connected to an input terminal 24, the power supply terminal 22, and the reference level supply circuit 21 at an internal output node for amplifying an input signal supplied with the input terminal into an amplified signal. A dummy circuit 25 is connected to the power supply terminal 22 and to the reference level supply circuit 21 at the internal output node for producing a reference signal. An emitter follower circuit 26 is connected to the power supply terminal 22, the common base circuit 23, the dummy circuit 25, an output terminal 27, and a reference output terminal 28 for supplying the amplified signal and the reference signal to the output terminal 27 and the reference output terminal 28, respectively.

The reference level supply circuit 21 has a first npn bipolar transistor Tr21 which has a first base, a first collector, and a first emitter. The first collector is connected to the first base and to the power supply terminal 22 through a first resistor R21. The first emitter is connected to the ground through a second resistor R22. A capacitor C is connected to the first base at the internal output node.

The common base circuit 23 has a second npn bipolar transistor Tr22 which has a second base, a second collector, and a second emitter. The second base is connected to the first base. The second collector is connected to the power supply terminal 22 through a third resistor R23. The second emitter is connected to the input terminal 24 and to the ground through a fourth resistor R24. The common base circuit 23 forms the first current mirror circuit with the reference level supply circuit 21.

The dummy circuit 25 has a third npn bipolar transistor Tr23 which has a third base, a third collector, and a third emitter. The third base is connected to the first base. The third collector is connected to the power supply terminal 22 through a fifth resistor R25. The third emitter is connected to the ground through a sixth resistor R26. The dummy circuit 25 forms the second current mirror circuit together with the reference level supply circuit 21.

The emitter follower circuit 26 has fourth through eighth npn bipolar transistors Tr24 to Tr28 and seventh through thirteenth resistors R27 to R33. The fourth transistor Tr24 has a fourth collector which is connected to the power supply terminal 22, a fourth base which is connected to the second collector, and a fourth emitter which is connected to the output terminal 27. The fifth transistor Tr25 has a fifth collector which is connected to the fourth emitter, a fifth emitter which is connected to the ground through a seventh resistor R27, and a fifth base which is connected to an eighth resistor R28. The sixth transistor Tr26 has a sixth collector which is connected to the power supply terminal 22, a sixth base which is connected to the third collector, and a sixth emitter which is connected to the reference output terminal 28. The seventh transistor Tr27 has a seventh collector which is connected to the sixth emitter, a seventh emitter which is connected to the ground through the ninth resistor R29, and a seventh base which is connected to a tenth resistor R30. The eighth transistor Tr28 has an eighth collector which is connected to the power supply terminal 22 through a eleventh resistor R31, an eighth emitter which is connected to the ground through an twelfth resistor R32, and an eighth base which is connected to the eighth collector, the eighth resistor R28, and the tenth resistor R30 through a thirteenth resistor R33.

In this structure, a first current flows through the reference level supply circuit 21, when the power supply terminal 22 is supplied with electric power from a power source (not shown). A part of the first current is supplied to the second base and the third base as the reference level. As a result, the first current causes second and third currents each of which is allowed to flow through the common base circuit 23 and through the dummy circuit 25, respectively. Even if the preamplifier is influenced by electromagnetic interference, a value of the second current is substantially equal to a value of the third current. Thus, an output signal of the common base circuit 23 and an output signal of the dummy circuit 25 are substantially equal to each other as long as the input terminal 12 is not supplied with an input signal.

When the input signal is supplied to the input terminal 24, the value of the second current is changed by the input signal. Consequently, the output signal changes with a change of the value of second current and represents the amplified signal. The output signal of the dummy circuit 25 represents the reference signal.

The fourth transistor Tr24 supplies the amplified signal which is given to the fourth base for the output terminal 27 from the fourth emitter. The sixth transistor Tr26 has the sixth base given the reference signal and the sixth emitter connected to the reference output terminal 28.

The preamplifier is small in size because of the common base circuit. The preamplifier has a strong immunity to the electromagnetic interference because the preamplifier utilizes the first and the second current mirror circuits.

A maximum input level of the preamplifier is determined by the third resistor R23 and a voltage across the third resistor R23. On the other hand, a maximum input level of the conventional preamplifier is determined by the fourth resistor R4 and a voltage across the third resistor R3. If each of the preamplifier and the conventional preamplifier is optimized for realizing a desirable operation speed, the third resistor R23 has a value of resistance which is nearly equal a value of resistance of the fourth resistor R4. In this condition, the voltage across the third resistor R3 has a value of about 0.8 volts when a voltage of the power source is equal to 5 volts. The voltage across the third resistor R23 has a value of about 1 to 2 volts when a voltage of the power source is equal to 3 volts. Namely, the preamplifier can be operated by low voltage power source and has a wide dynamic range.

What is claimed is:

1. A preamplifier for amplifying an input signal supplied to an input terminal to supply an amplified output signal and a reference output signal to an output terminal and a reference output terminal, respectively, said preamplifier comprising:

an amplifier which is connected to said input terminal and said output terminal and which has a predetermined structure and an internal output node different from said reference output terminal, for amplifying said input signal into said amplified output signal to supply said amplified output signal to said output terminal;

a reference level circuit connected to said internal output node for supplying a reference level to said internal output node; and a dummy circuit which is connected to said reference level circuit at said internal output node and which has a structure identical with said predetermined structure, for amplifying said reference level into said reference output signal which is sent through said reference output terminal without being fed back to said amplifier.

2. A preamplifier as claimed in claim 1, wherein said amplifier is a common base circuit.

3. A preamplifier as claimed in claim 2, wherein said common base circuit has a bipolar transistor which has an emitter connected to said input terminal, a collector connected to said output terminal, and a base connected to said reference level circuit.

4. A preamplifier as claimed in claim 1, wherein said dummy circuit and said reference level circuit form a current mirror circuit.

5. A preamplifier as claimed in claim 1, said preamplifier further comprising an emitter follower circuit which is connected to both said output terminal and said reference output terminal.

6. An integrated circuit having a preamplifier arranged on a chip, said preamplifier for amplifying an input signal supplied to an input terminal to supply an amplified output signal and a reference output signal to an output terminal and a reference output terminal, respectively, said integrated circuit comprising:

an amplifier which is connected to said input terminal and said output terminal and which has a predetermined structure and an internal output node different from said reference output terminal, for amplifying said input signal into said amplified output signal to supply said amplified output signal to said output terminal;

a reference level circuit connected to said internal output node for supplying a reference level to said internal output node; and a dummy circuit which is connected to said reference level circuit at said internal output node and which has a structure identical with said predetermined structure, for amplifying said reference level into said reference output signal which is sent through said reference output terminal without being fed back to said amplifier.

7. A preamplifier for amplifying an input signal supplied to an input terminal to supply an amplified output signal and a reference output signal to an output terminal and a reference output terminal, respectively, said preamplifier comprising:

a common base circuit connected to said input terminal and said output terminal and having a predetermined structure and a first bipolar transistor which has a first emitter connected to said input terminal, a first collector connected to said output terminal, and a first base connected to an internal output node different from said reference output terminal, said common base circuit for amplifying said input signal into said amplified output signal given to said output terminal;

a reference power source connected to said internal output node for supplying a reference electric power signal to said internal output node;

a dummy circuit having a structure identical with said predetermined structure and having a second bipolar transistor which has a second emitter, a second collector connected to said reference output terminal, and a second base connected to said internal output node, said dummy circuit being for amplifying said reference electric power signal into said reference output signal which is sent through said reference output terminal without being fed back to said amplifier.

8. A preamplifier as claimed in claim 7, said preamplifier further comprising:

an emitter-follower circuit having a third bipolar transistor and a fourth bipolar transistor, said third bipolar transistor having a third base connected to said output terminal and a third emitter connected to another output terminal, said fourth bipolar transistor having a fourth base connected to said reference output terminal and a fourth emitter connected to another reference output terminal, for transforming an impedance.

* * * * *

UNITED STATES PATENT AND TRADEMARK OFFICE
CERTIFICATE OF CORRRECTION

PATENT NO. : 5,793,256
DATED : August 11, 1998
INVENTOR(S) : Nagahori et al.

It is certified that error appears in the above-identified patent and that said Letters Patent is hereby corrected as shown below:

On the title page , item [56] please insert:

U. S. PATENT DOCUMENTS

| EXAMINER INITIAL | | PATENT NUMBER | | | | | | ISSUE DATE | PATENTEE | CLASS | SUBCLASS | FILING DATE IF APPROPRIATE |
|---|---|---|---|---|---|---|---|---|---|---|---|---|
| | | 4 | 3 | 7 | 5 | 0 | 3 | 7 | 2/83 | Ikushima | | | |
| | | | | | | | | | | | | | |

FOREIGN PATENT OR PUBLISHED FOREIGN PATENT APPLICATION

| | | DOCUMENT NUMBER | | | | | | PUBLICATION DATE | COUNTRY OR PATENT OFFICE | CLASS | SUBCLASS | TRANSLATION YES | NO |
|---|---|---|---|---|---|---|---|---|---|---|---|---|---|
| | | 2 | 7 | 2 | 0 | 6 | 1 | 4 | 11/78 | Germany | | | | |
| | | | | | | | | | | | | | | |

Signed and Sealed this

Fourth Day of May, 1999

Attest:

Attesting Officer

Q. TODD DICKINSON

Acting Commissioner of Patents and Trademarks